United States Patent [19]

Beno et al.

[11] 4,050,070
[45] Sept. 20, 1977

[54] PROGRAMMABLE MICROWAVE MODULATOR

[75] Inventors: Lawrence A. Beno, Camarillo; Kazumasa Doi, Ventura, both of Calif.

[73] Assignee: The United States of America as represented by the Secretary of the Navy, Washington, D.C.

[21] Appl. No.: 691,923

[22] Filed: June 1, 1976

[51] Int. Cl.$^2$ ............................................. G01S 9/56
[52] U.S. Cl. .......................... 343/6.8 LC; 343/18 D; 343/18 E
[58] Field of Search ............ 343/6.8 R, 6.8 LC, 18 D, 343/18 E, 5 DP

[56] References Cited

U.S. PATENT DOCUMENTS

| 3,706,994 | 12/1972 | Uhrig | 343/18 E X |
|---|---|---|---|
| 3,765,018 | 10/1973 | Heard et al. | 343/5 DP X |
| 3,792,475 | 2/1974 | Smetana | 343/18 E X |
| 3,827,027 | 7/1974 | Towson et al. | 343/5 DP X |
| 4,005,418 | 1/1977 | Gorwara | 343/6.8 R |

Primary Examiner—T.H. Tubbesing
Attorney, Agent, or Firm—Richard S. Sciascia; Joseph M. St.Amand; Darrell E. Hollis

[57] ABSTRACT

A programmable microwave modulator for controlling the amplitude of a microwave signal versus time. A programmed driver generates a linear analog signal that has a predetermined amplitude pattern and time period. The linear analog signal from the programmable driver passes through a linearized current driver before inputting a PIN attenuator. The linearized current driver takes the antilogarithm of the linear analog signal, thus compensating for the logarithmic nonlinearity of the PIN attenuator. A radio frequency signal from a receiving antenna inputs the PIN attenuator and is attenuated as a function of the amplitude pattern of the linear analog signal. The PIN attenuator outputs the attenuated radio frequency signal.

12 Claims, 5 Drawing Figures

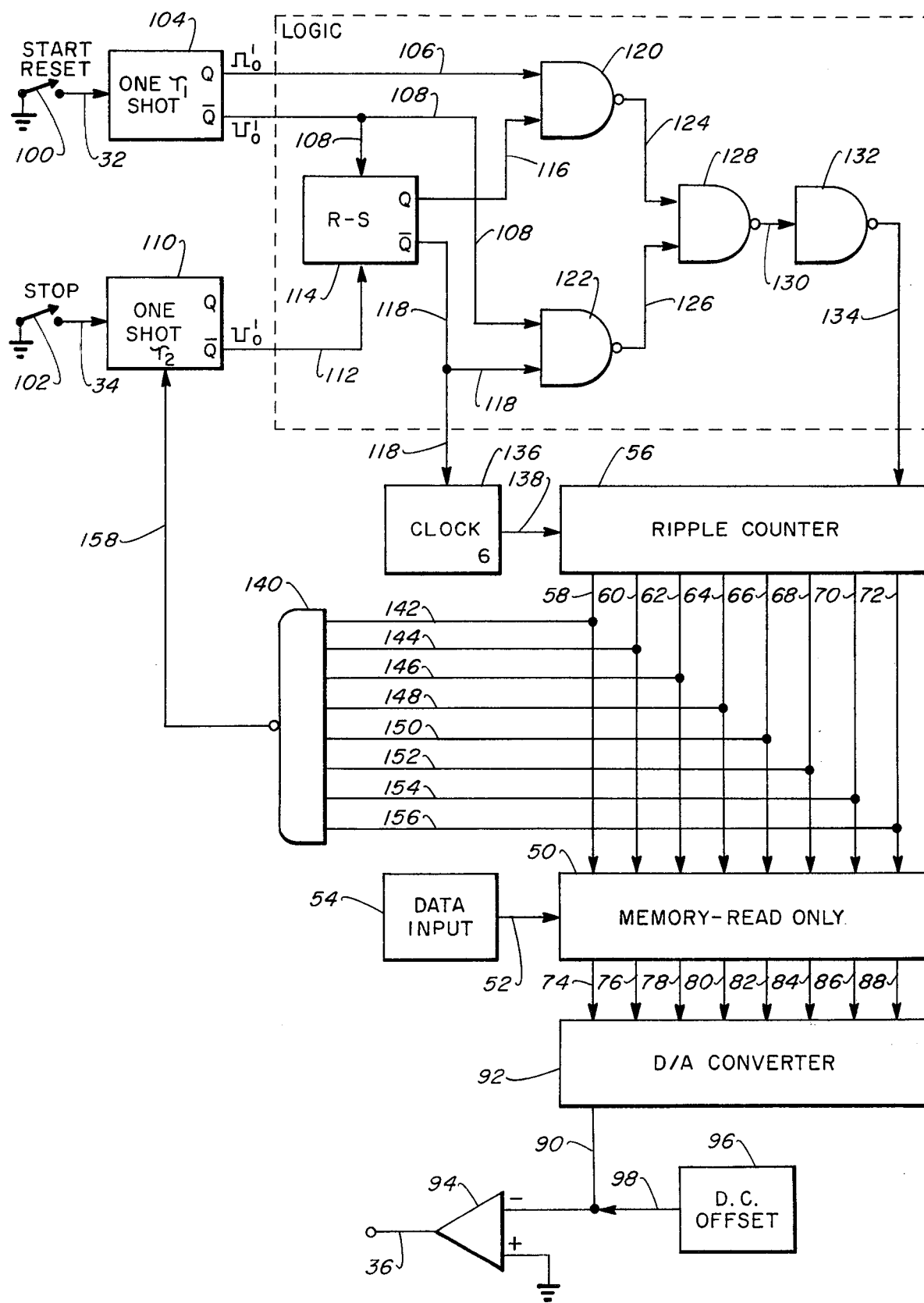
Fig. 2. PROGRAMMED DRIVER

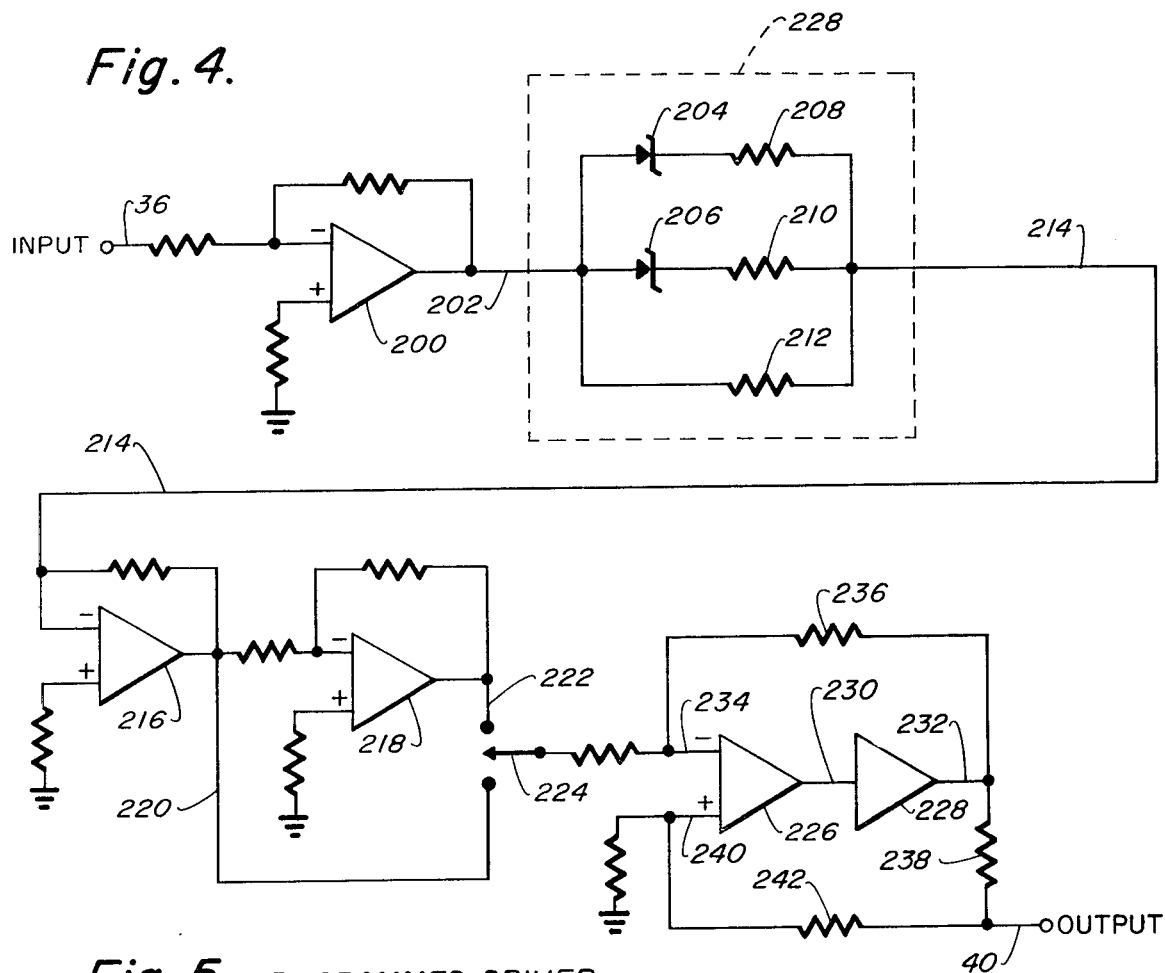
Fig. 4.
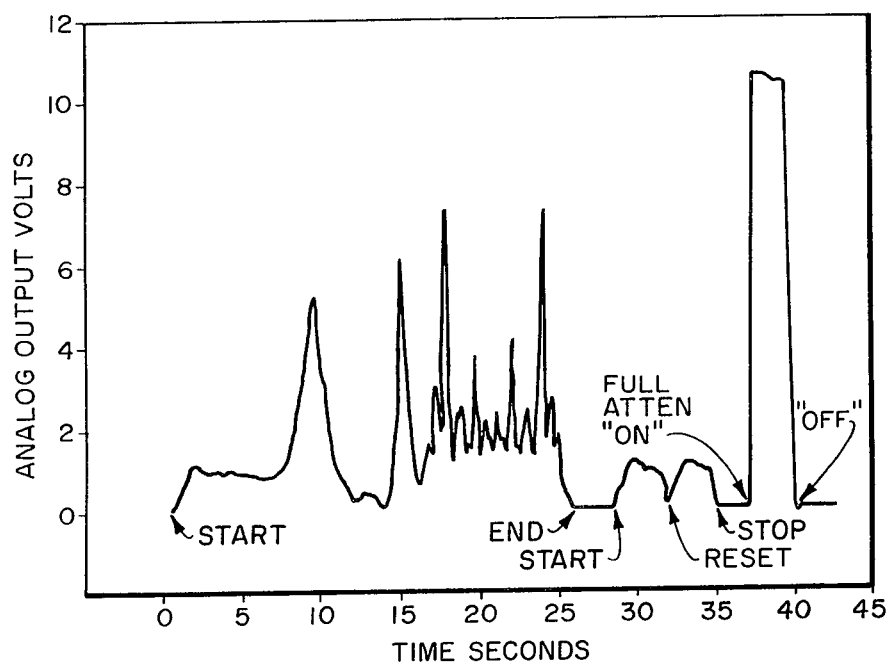
Fig. 5. PROGRAMMED DRIVER 4,050,070

PROGRAMMABLE MICROWAVE MODULATOR

BACKGROUND OF THE INVENTION

1. Field of the Invention

The present invention relates generally to microwave modulators and more particularly to such modulators capable of being programmed.

2. Description of the Prior Art

Prior art devices for modulating radio frequency signals include devices utilizing mechanical cams to control the modulation pattern. The resolution is extremely poor and the response time very slow in such devices. In addition, the system flexibility is limited when such devices are used with remote controls.

SUMMARY OF THE INVENTION

The general purpose of the present invention is to provide a compact and reliable solid state programmable microwave modulator. To attain this, the present invention provides a programmed driver which generates a linear analog signal. A linearized current driver takes the antilogarithm of the linear analog signal. The antilogarithm of the linear analog signal inputs a PIN attenuator to control the attenuation pattern of the PIN attenuator. A radio frequency signal inputting the PIN attenuator is attenuated as a linear function of the linear analog signal generated by the programmed driver.

Accordingly, one object of the present invention is to provide a programmable microwave modulator.

Another object of the present invention is to provide a compact and reliable programmable microwave modulator.

Still another object of the present invention is to increase versatility.

A further object of the instant invention is to minimize the number of components necessary for operation.

Other objects and a more complete appreciation of the present invention and its many attendant advantages will develop as the same becomes better understood by reference to the following detailed description when considered in connection with the accompanying drawings in which like reference numerals designate like parts throughout the figures thereof and wherein.

BRIEF DESCRIPTION OF THE DRAWINGS

FIG. 2 is a block diagram of the programmed driver of FIG. 1.

FIG. 4 is a schematic diagram of the linearized current driver block of FIG. 1.

FIG. 5 illustrates a linear analog signal generated by the programmed driver block of FIG. 1.

DETAILED DESCRIPTION OF THE PREFERRED EMBODIMENT

Figure 1:
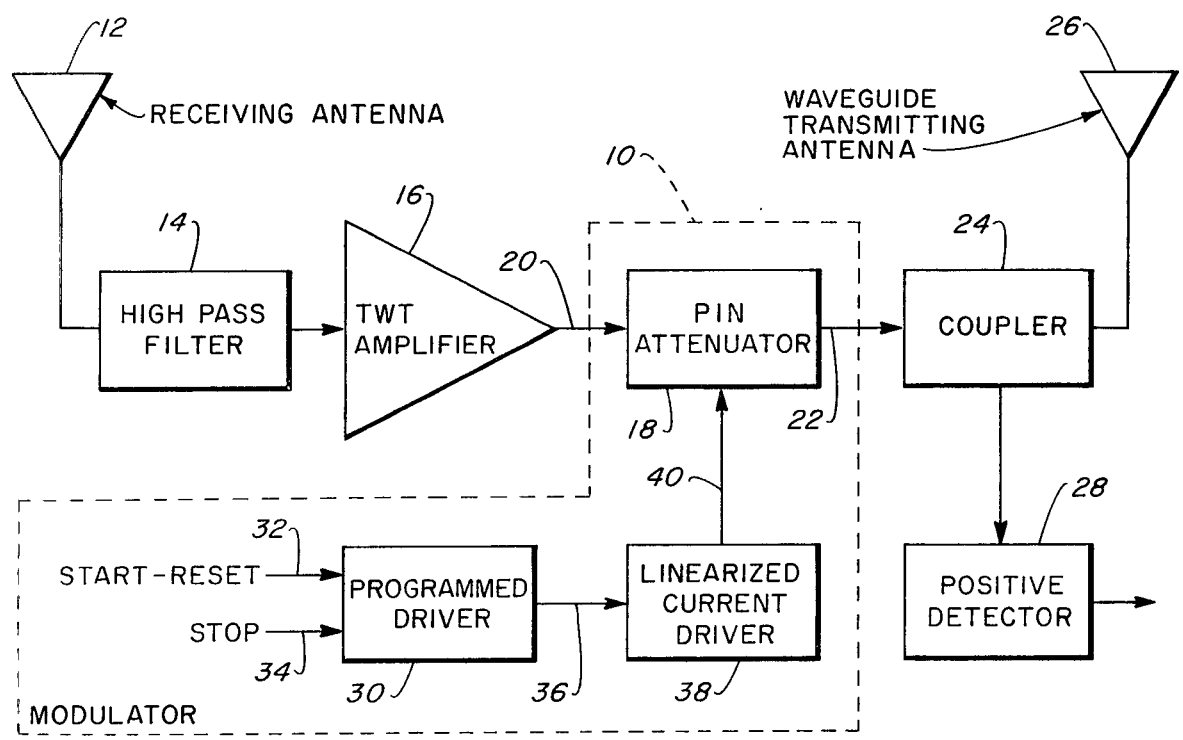
FIG. 1 is a block diagram of a specific embodiment of the present invention.

Turning to FIG. 1, one embodiment 10 of the present invention is illustrated. Receiving antenna 12 receives a radio frequency signal. The radio frequency signal is filtered by high pass filter 14 and then amplified by TWT amplifier 16. The filtered and amplified radio frequency signal then inputs PIN attenuator 18 via line 20. After attenuation, the radio frequency signal inputting PIN attenuator 18 on line 20 is outputed from PIN attenuator 18 on line 22. The attenuated radio frequency signal on line 22 passes through coupler 24 to waveguide transmitting antenna 26 and to positive detector 28. The output of positive detector 28 goes to a telemetry monitor which is not shown in FIG. 1.

Programmed driver 30 is inputed on line 32 by a start reset pulse, and on line 34 by a stop pulse. Programmed driver 30 outputs on line 36 a linear analog signal which has a predetermed amplitude pattern and a predetermined time period. The linear analog signal appearing on line 36 is started, stopped, and reset by the pulses received on lines 32 and 34.

Linearized current driver 38 takes the antilogarithm of the linear analog signal appearing on line 36. The antilogarithm of the linear analog signal on line 36 is outputed on line 40 which inputs PIN attenuator 18.

The signal on line 40 controls the attenuation pattern of PIN attenuator 18. Linearized current driver 38 takes the antilogarithm of the linear analog signal on line 36 generated by programmed driver 30 to compensate for the logarithmic nonlinearity of the PIN attenuator 18.

Now turning to FIG. 2, a block diagram of programmed driver 30 is illustrated. Read only memory 50 contains a specific number of memory address locations. Data input 54 inputs data into these memory address locations via line 52. The data stored in memory 50 determines the attenuation pattern imparted to the radio frequency signal on line 20 of FIG. 1 by PIN attenuator 18.

Ripple counter 56 also inputs read only memory 50 on lines 58 through 72. The digital signals appearing on lines 58 through 72 from ripple counter 56 address a specific memory address location in memory 50, thus causing the contents of that memory address location to be read out on lines 74 through 88. The data entered into memory 50 by data input 54 contains the amplitude pattern for the linear analog signal appearing on line 36. The digital data read out of the memory address locations of memory 50 onto lines 74 through 84 are converted to an analog signal appearing on line 90 by D to A converter 92. The analog signal on line 90 is amplified by operational amplifier 94. DC offset 96 provides an adjustable DC offset signal on line 98 to set initial conditions of the linear analog signal appearing on line 36.

Monostable multivibrator 104 outputs a logic one pulse on line 106 and simultaneously a logic zero pulse onto line 108 when line 32, which inputs monostable multivibrator 104, is grounded by switch 100. Switch 100 generates a start/reset pulse. Monostable multivibrator 104 has a time constant $T_1$ associated therewith.

Monostable multivibrator 110 outputs a logic zero pulse onto line 112 when line 34, which inputs monostable multivibrator 110, is grounded by switch 102. Monostable multivibrator 110 has a time constant $T_2$ associated therewith. $T_2$ is larger than $T_1$. Switch 102 provides a stop pulse to multivibrator 110. It is noted that switch 100 and switch 102 are shown in FIG. 2 as manual switches, however, the functions provided by switches 100 and 102 may be accomplished by means other than manual switches such as switching transistors or other electronically controlled switching elements.

Bistable multivibrator or RS flip flop 114 is inputed by lines 108 and 112. When a logic zero pulse appears on line 108, bistable multivibrator 114 assumes a first stable condition with a logic one signal appearing on line 116 and a logic zero signal appearing on line 118. Bistable multivibrator 114 remains in this stable condition until a logic zero pulse is received on line 112. When a logic zero pulse is received on line 112, bistable multivibrator 114 changes to a second stable condition with a logic one signal appearing on line 118 and a logic zero signal appearing on line 116.

Lines 106 and 116 input NAND gate 120 while lines 108 and 118 input NAND gate 122. The outputs of NAND gates 120 and 122, lines 124 and 126, respectively, input NAND gate 128. NAND gate 128 inputs NAND gate 132 via line 130. The output of NAND gate 132, line 134, inputs ripple counter 56. The signal on line 134 enables and disables clock 136 from triggering ripple counter 56. Clock 136 inputs ripple counter 56 via line 138.

Whenever start/reset switch 100 grounds line 32, monostable multivibrator 104 outputs simultaneously on lines 106 and 108, respectively, a logic one and a logic zero pulse. Assuming bistable multivibrator 114 is in the second stable condition with a logic one signal appearing on line 118 and a logic zero signal appearing on line 116, the logic zero signal inputting bistable multivibrator 114 on line 108 toggles bistable multivibrator 114, thereby causing bistable multivibrator 114 to change state with a logic one signal appearing on line 116 and logic zero signal appearing on line 118. With these conditions present, a logic zero signal appears on line 134, thus enabling the clock pulses on line 138 from clock 136 to clock ripple counter 56. Whenever the signal on line 134 goes from a logic one level to a logic zero level, or vice versa, ripple counter 56 is reset; thus, when line 32 is grounded by start/reset switch 100, ripple counter 56 starts counting upwards from zero.

Assuming that bistable multivibrator 114 is in the first stable condition whereby a logic one signal appears on line 116 and a logic zero signal appears on line 118 with a logic zero signal appearing on line 134 and ripple counter 56 counting upwards, when start/reset switch 100 grounds line 32, the zero logic signal appearing on line 108 does not cause bistable multivibrator 114 to change state. However, the logic one pulse appearing on line 106 is propagated through NAND gates 120, 128 and 132 to disable ripple counter 56 for the width of the pulse on line 106 and resets ripple counter 56 back to zero. After the propagated logic one pulse resets ripple counter 56, ripple counter 56 is again enabled and counts upward from zero.

When line 34 of switch 102 is grounded, with bistable multivibrator 114 in the first stable condition, a logic zero pulse appears on line 112 which causes bistable multivibrator 114 to change state to the second stable condition with a logic zero level appearing on line 116 and a logic one level appearing on line 118. This causes a logic one signal to appear on line 134 which resets ripple counter 56 and disables the clock pulses from clock 136 from clocking ripple counter 56. Also, a logic one level on line 118 inputs clock 136, thereby disabling clock 136. This feature is redundant.

NAND gate 140 has eight inputs labeled 142 to 156. Line 142 is connected to line 58, line 144 is connected to line 60, line 146 is connected to line 62, line 148 is connected to line 64, line 150 is connected to line 66, line 152 is connected to line 68, line 154 is connected to line 70, and line 156 is connected to line 72. Whenever a logic one signal appears on each of lines 58 through 72, NAND gate 140 outputs on line 158 a signal which causes monostable multivibrator 110 to output a logic zero pulse on line 112. This pulse causes bistable multivibrator 114 to change state, thus causing a logic one level signal to appear on line 134, thereby disabling the clock pulses on line 138 from clocking ripple counter 56.

Thus, ripple counter 56 starts at zero, thereby addressing address memory location zero and reading the data in address memory location zero out to D to A converter 92, and proceeds addressing sequentially upwards until all ones appear on each line 58 through 72, or until switch 102 is grounded, at which time ripple counter 56 is disabled by the signal on line 134. Thus, the data read in to memory controls the amplitude pattern of the analog signal on line 36 as it is read out onto lines 74 – 88 in sequential order by memory address locations and converted into an analog level by D to A converter 92.

The clock 136 may be set at any desired frequency. The time period of the clock pulse signals on line 138 control the counting speed of ripple counter 56, thus controlling or determining the period of the analog signal appearing on line 36.

Of course, ripple counter 56 may have fewer or greater outputs into memory 50 than are shown in FIG. 2. In addition, memory 50 may be of variable size, depending upon the desired signal to be generated.

Figure 3:
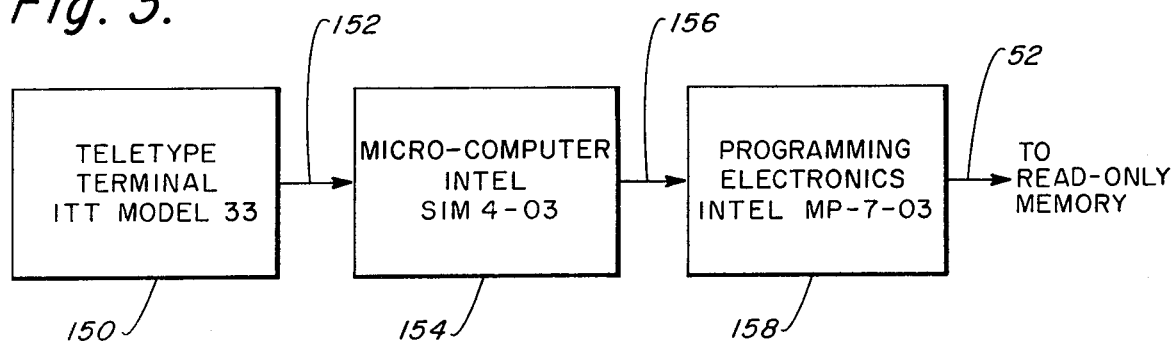
FIG. 3 is a block diagram of the data input block of FIG. 2.

Now turning to FIG. 3, a block diagram illustrating the data input block 54 of FIG. 2 is shown. Teletype terminal 150 inputs microcomputer 154 on line 152. Microcomputer 154 inputs programming electronics 158 via line 156. Programming electronics 158 outputs on line 52 which inputs read only memory 50. Data is inputed into data input 54 by teletype terminal 150 and injected into memory 50 via line 52. It is noted that teletype terminal 150 could be a card reader or other computer input device. As shown in FIG. 3, teletype terminal 150 is a commercially available unit, e.g., ITT Model 33. Microcomputer 154 is a commercially available unit, e.g., Intel Model SIM 4-03. Programming electronics 158 is a commercially available device, e.g., Intel Model MP-7-03.

Now turning to FIG. 4, a schematic diagram of linearized current driver of FIG. 1 is illustrated. The linear analog signal from programmed driver 30 inputs operational amplifier 200 on line 36. Operational amplifier 200 amplifies or serves as a buffer amplifier for the signal on line 36. Operational amplifier 200 outputs the amplified signal on line 202 to zener diode circuit 228. Zener diode circuit 228 consists of three parallel arms; one parallel arm containing zener diode 204 and resistor 208, the second zener diode arm containing zener diode 206 and resistor 210, and the third zener diode circuit arm containing resistor 212. Zener diode circuit 228 takes the antilogarithm of the linear analog signal appearing on line 202. This antilogarithm signal outputs to operational amplifier 216 via line 214 and is inverted by operational amplifier 218. Switch 224 chooses either the signal on line 220 or the inverted signal on line 222 to input buffer operational amplifier 226. Buffer amplifier 226 inputs operational amplifier 228 via line 230. Operational amplifier 228 outputs on line 232. Output 232 is connected back to inverting input 234 through resistor 236 and to output line 40 through resistor 238. Output line 40 is connected back to noninverting input 240 through resistor 242. Operational amplifiers 226 and 228 and resistors 236, 238, and 242 produce an antilogarithm current signal output on line 40 to drive PIN attenuator 18.

FIG. 5 illustrates a linear analog signal appearing on line 36 of FIG. 2 from programmed driver 30.

Obviously, numerous modifications and variations of the present invention are possible in light of the above teachings. It is therefore to be understood that within the scope of the appended claims the invention may be practiced otherwise than as specifically described herein.

One use, among many, for the present invention includes target augmentation. In the testing of missiles, there is a need to vary the radar signature of the target as seen by the missile. In this manner, a single target can be utilized to simulate a number of different threats. The present invention performs this valuable and significant function by modulating a received microwave signal prior to transmitting it to the missile.

What is claimed is:

1. A programmable microwave modulator comprising:
   a. means for providing a radio frequency signal from a receiving antenna;
   b. programmable driver means for providing a linear analog signal that is predetermined both as to amplitude pattern and time period;
   c. attenuator means responsive to said linear analog signal for attenuating said radio frequency signal; and
   d. linearizing current driver means connected between said programmable driver means and said attenuator means for operating on said linear analog signal such that said radio frequency signal is attenuated by said attenuator means as a linear function of said linear analog signal.

2. The apparatus of claim 1 wherein said programmable driver means includes:
   a. a memory having a plurality of memory address locations for storing digital data;
   b. means for entering digital data into said memory, said digital data determining said amplitude pattern of said linear analog signal;
   c. means for sequentially addressing said memory and sequentially reading out the digital data stored in a predetermined number of memory address locations;
   d. means connected to said memory for converting the digital data read out of said memory to said linear analog signal.

3. The apparatus of claim 2 wherein said addressing and reading out means includes:
   a. a ripple counter generating a plurality of output signals inputing said memory, said plurality of ripple counter output signals defining the memory address location read out of said memory;
   b. means connected to said ripple counter for generating a series of timed clock pulses having a predetermined period, the period of said clock pulses determining the period of said linear analog signal, each said clock pulse advancing said ripple counter by one;
   c. means connected to said ripple counter for enabling and disabling said clock means from said ripple counter, thereby starting or stopping and resetting said ripple counter.

4. The apparatus of claim 3 wherein said enabling and disabling means includes:
   a. means for generating a start-reset pulse;
   b. means for generating a first stop pulse;
   c. a first monostable multivibrator having a first specific time constant associated therewith for generating a first logic one pulse and a first logic zero pulse simultaneously in response to said start-reset pulse;
   d. means connected to said plurality of ripple counter outputs for generating a second stop pulse when said predetermined number of memory address locations have been addressed and read out;
   e. a second monostable multivibrator having a second specific time constant associated therewith for generating a second logic zero pulse in response to said first and second stop pulses, said second time constant being larger than said first time constant;
   f. logic means connected to receive said first logic zero pulse, said first logic one pulse, and said second logic zero pulse for generating a continuous enable signal after receiving said first logic one pulse and said first logic zero pulse, for generating a continuous disable signal after receiving said second logic zero pulse, for generating a temporary disable signal after receiving said first logic one pulse and said first logic zero pulse for the second time without the intervening reception of said second logic zero pulse, said enable signal resetting said ripple counter and enabling said clock means, said disable signal resetting said ripple counter and disabling said clock means.

5. The apparatus of claim 4 wherein said logic means includes:
   a. a bistable multivibrator connected to receive said first and second logic zero pulses, said first and second logic zero pulses triggering said bistable into respective first and second stable conditions;
   b. gate means connected to said bistable multivibrator and connected to receive said first logic one pulse and said first logic zero pulse for generating said continuous enable signal when said bistable multivibrator is in said first stable condition, for generating said continuous disable signal when said bistable multivibrator is in said second stable condition, and for generating a temporary disable signal when said bistable multivibrator is in said first stable condition and said gate means receives said first logic one pulse and said first logic zero pulse.

6. The apparatus of claim 4 wherein said second stop pulse generating means includes a NAND gate having a plurality of inputs, one each connected to receive a respective output signal from said ripple counter.

7. The apparatus of claim 1 wherein said attenuator means includes a PIN attenuator.

8. The apparatus of claim 1 wherein said linearizing current driver means includes:
   a. means for generating the antilogarithm of said linear analog signal; and
   b. linear amplifying means for amplifying the antilogarithm of said linear analog signal, said antilogarithm of said linear analog signal inputing said attenuator means.

9. The apparatus of claim 8 wherein said antilogarithmic signal generating means includes a zener diode circuit.

10. A circuit for generating a linear analog signal having a predetermined amplitude pattern and period comprising:
   a. a memory having a plurality of memory address locations for storing digital data;
   b. means for entering digital data into said memory, said digital data determining said amplitude pattern of said linear analog signal;

c. means for sequentially addressing said memory and sequentially reading out the digital data stored in a predetermined number of memory address locations;

d. a ripple counter generating a plurality of output signals inputing said memory, said plurality of ripple counter output signals defining the memory address location read out of said memory;

e. means connected to said ripple counter for generating a series of timed clock pulses having a predetermined period, the period of said clock pulses determining the period of said linear analog signal, each said clock pulse advancing said ripple counter by one; thereby sequentially addressing said memory and sequentially reading out the digital data stored in a predetermined number of memory address locations;

f. means for generating a start-reset pulse;

g. means for generating a first stop pulse;

h. a first monostable multivibrator having a first specific time constant associated therewith for generating a first logic one pulse and a first logic zero pulse simultaneously in response to said start-reset pulse;

i. means connected to said plurality of ripple counter outputs for generating a second stop pulse when said predetermined number of memory address locations have been addressed and read out;

j. a second monostable multivibrator having a second specific time constant associated therewith for generating a second logic zero pulse in response to said first and second stop pulses, said second time constant being larger than said first time constant;

k. logic means connected to receive said first logic zero pulse, said first logic one pulse, and said second logic zero pulse for generating a continuous enable signal after receiving said first logic one pulse and said first logic zero pulse, for generating a continuous disable signal after receiving said second logic zero pulse, for generating a temporary disable signal after receiving said first logic one pulse and said first logic zero pulse for the second time without the intervening reception of said second logic zero pulse, said enable signal resetting said ripple counter and enabling said clock means, said disable signal resetting said ripple counter and disabling said clock means;

l. means connected to said memory for converting the digital data read out of said memory to said linear analog signal.

11. The apparatus of claim 10 wherein said logic means includes:

a. a bistable multivibrator connected to receive said first and second logic zero pulses, said first and second logic zero pulses triggering said bistable into respective first and second stable conditions;

b. gate means connected to said bistable multivibrator and connected to receive said first logic one pulse and said first logic zero pulse for generating said continuous enable signal when said bistable multivibrator is in said first stable condition, for generating said continuous disable signal when said bistable multivibrator is in said second stable condition, and for generating a temporary disable signal when said bistable multivibrator is in said first stable condition and said gate means receives said first logic one pulse and said first logic zero pulse.

12. The apparatus of claim 10 wherein said second stop pulse generating means includes a NAND gate having a plurality of inputs, one each connected to receive a respective output signal from said ripple counter.

* * * * *